United States Patent [19]

Garnache et al.

[11] Patent Number: 4,769,786

[45] Date of Patent: Sep. 6, 1988

[54] TWO SQUARE MEMORY CELLS

[75] Inventors: Richard R. Garnache; Donald M. Kenney, both of Shelburne, Vt.

[73] Assignee: International Business Machines Corporation, Armonk, N.Y.

[21] Appl. No.: 885,618

[22] Filed: Jul. 15, 1986

[51] Int. Cl.[4] .................. G11C 13/00; G11C 11/40
[52] U.S. Cl. ................... 365/182; 365/149; 357/23.1; 357/23.6
[58] Field of Search ............ 365/149, 182, 185; 357/23.1, 45, 23.6

[56] References Cited

U.S. PATENT DOCUMENTS

| | | | |
|---|---|---|---|
| 3,387,286 | 6/1968 | Dennard | 340/173 |
| 3,811,076 | 5/1974 | Smith | 317/235 R |
| 3,841,926 | 10/1974 | Garnache et al. | 148/188 |
| 4,222,062 | 9/1980 | Trotter et al. | 357/23 |
| 4,225,945 | 9/1980 | Chang-Kiang Huo | 365/149 |
| 4,271,418 | 6/1981 | Hiltpold | 357/23 |
| 4,295,924 | 10/1981 | Garnache et al. | 156/643 |
| 4,327,476 | 5/1982 | Iwai et al. | 29/571 |
| 4,335,450 | 6/1982 | Thomas | 365/182 |
| 4,462,040 | 7/1984 | Ho et al. | 357/23 |
| 4,663,644 | 5/1987 | Shimizu | 357/23.14 |
| 4,672,410 | 6/1987 | Miura | 357/23.6 |
| 4,673,962 | 6/1987 | Chatterjee et al. | 365/149 |

OTHER PUBLICATIONS

WO81/03241 Patent Coop Treaty, 11/81.
Ser. No. 793,401, 10/85, D. M. Kenney.
Ser. No. 858,787, 05/86, B. F. Fitzgerald et al.
IBM Tech. Disc. Bul., vol. 27, No. 2, Jul. 1984, "Compact One-Device Dynamic Ram Cell with High Storage Capacitance", C. G. Jambotkar, pp. 1313-1320.

Primary Examiner—Terrell W. Fears
Attorney, Agent, or Firm—Stephen J. Limanek

[57] ABSTRACT

A memory is provided which includes a semiconductor substrate having a major surface and a trench disposed therein having a longitudinal axis, storage means disposed on a given sidewall of the trench, switching means having a control element and a current carrying element disposed on the given sidewall of the trench between the storage means and the major surface of the substrate and coupled to the storage means, a first electrically conductive line disposed on the given sidewall in contact with the control element of the switching means and having a longitudinal axis arranged parallel to the longitudinal axis of the trench, and a second electrically conductive line disposed on the major surface of the semiconductor substrate in contact with the current carrying electrode of the switching means and having a longitudinal axis arranged orthogonal to the longitudinal axis of the trench.

23 Claims, 3 Drawing Sheets

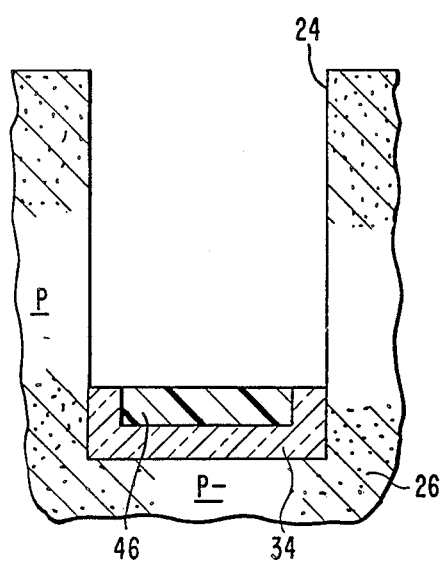
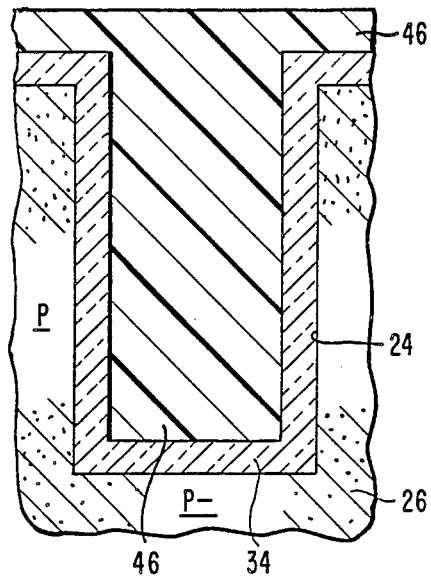
FIG. 7　　　FIG. 8
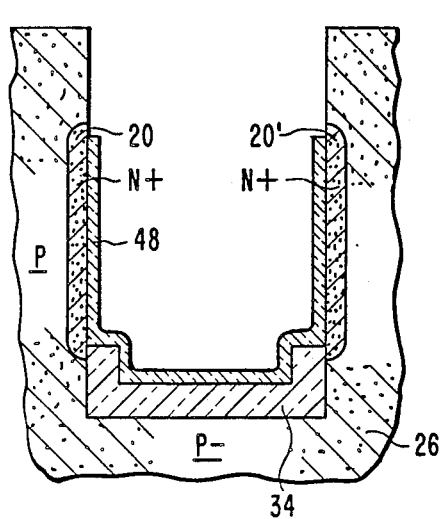
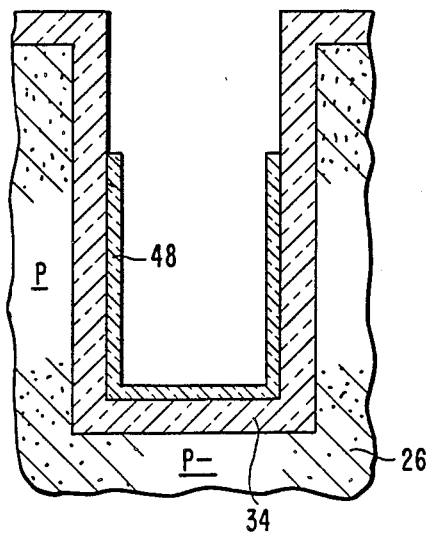
FIG. 9　　　FIG. 10

TWO SQUARE MEMORY CELLS

TECHNICAL FIELD

This invention relates to integrated semiconductor memory circuits and more particularly to a memory with a very high density of cells, each of which employs means for storing a binary digit of information in a trench or groove.

BACKGROUND ART

Integrated semiconductor memory circuits, particularly those employing cells which include essentially a storage capacitor and a switch have achieved high memory cell densities. One of the simplest circuits for providing a small dynamic memory cell is described in commonly assigned U.S. Pat. No. 3,387,286, filed July 14, 1967, by R. H. Dennard. Each cell employs a storage capacitor and a field effect transistor acting as a switch to selectively connect the capacitor to a bit/sense line.

In also commonly assigned U.S. Pat. Nos. 3,811,076 by W. M. Smith, and 3,841,926 by R. R. Garnache and W. M. Smith, both filed on Jan. 2, 1973, there is disclosed a one device field effect transistor memory cell of the type described in the hereinabove identified Dennard patent which utilizes a layer of doped polysilicon and an N+ diffusion region in a P type conductivity semiconductor substrate separated by a dielectric medium disposed on the surface of the semiconductor substrate for forming the storage capacitor of the well. The polysilicon layer extends beyond the storage capacitor to act as a field shield between adjacent cells by applying a negative bias or fixed negative potential to the polysilicon layer. The N+ diffusion region of the storage capacitor is formed by using a doped segment of an insulating layer disposed on the surface of the semiconductor substrate and outdiffusing the dopant into the substrate.

Although the cells described hereinabove do provide memories having a high density of cells in a planar or two dimensional arrangement, yet each cell does require a significant given area of semiconductor substrate surface. To reduce the size of the given surface area for each cell, structures have been made wherein a semiconductor device or a cell is formed in a three dimensional arrangement. In commonly assigned U.S. Pat. No. 4,295,924, filed on Dec. 17, 1979 by R. R. Garnache and D. M. Kenney, there is disclosed a semiconductor device located within a groove or trench with a self-aligned conductive layer formed on a wall of the trench either directly or on a supporting insulating layer as an element of the device. A memory cell formed in a groove or trench is described in commonly assigned U.S. Pat. No. 4,335,450, filed on Jan. 30, 1980, by D. R. Thomas, wherein there is disclosed a cell having a transistor disposed on a sidewall of a groove or trench with the storage node disposed below the transistor. Also U.S. Pat. No. 4,327,476, filed on Nov. 28, 1980, describes a vertical cell having the storage capacitor in a well or trench.

Patent Cooperation Treaty (PCT) Publication No. WO 81/03241, dated Nov. 12, 1981, discloses a one device memory cell structure wherein the storage capacitor is disposed in a trench with the switching device and bit/sense line located at the surface of the substrate.

Furthermore, commonly assigned U.S. Pat. No. 4,462,040, filed on Mar. 30, 1980, by I. T. Ho and J. Riseman, discloses a one device dynamic random access memory utilizing a trench having vertical sidewalls with the storage capacitor and the transfer device located within the trench, and U.S. Pat. Nos. 4,271,418, filed on Oct. 29, 1979, and 4,225,945, filed on June 6, 1977, and commonly assigned U.S. patent application having Ser. No. 793,401, filed on Oct. 31, 1985, by D. M. Kenney, U.S. Pat. No. 4,751,558, teach a one device memory cell formed in a groove or trench with the storage node located at the bottom of the trench, the bit/sense line at the top of this structure and the transfer device on the sidewall of the trench.

U.S. Pat. No. 4,222,062, filed on May 4, 1976, discloses a memory cell structure wherein a switching device is formed near the bottom of a trench with the bit line and storage capacitor located at a wall of the trench.

Commonly assigned U.S. patent application having Ser. No. 858,787, filed on May 2, 1986, by B. F. Fitzgerald, K. Y. Nguyen and S. V. Nguyen, describes a dynamic memory cell wherein the switching device is located at the bottom of the trench, with the storage capacitor and the bit/sense line being formed along opposite sidewalls of the trench.

None of the hereinabove cited prior art discloses a memory cell having a semiconductor substrate surface area of less than four lithographic squares.

DISCLOSURE OF THE INVENTION

It is an object of this invention to provide a memory cell which occupies, along with necessary isolation means, only two lithographic squares of the surface of a semiconductor substrate, wherein one lithographic square is defined by the intersection of two lithographic lines, each line being of any given width, e.g., less than a micron, as used in forming elements of devices in integrated semiconductor circuits.

In accordance with the teachings of this invention, a memory is provided which includes a semiconductor substrate having a major surface and a trench disposed therein having a longitudinal axis, storage means disposed on a given sidewall of the trench, switching means having a control element and a current carrying element disposed on the given sidewall of the trench between the storage means and the major surface of the substrate and coupled to the storage means, a first electrically conductive line disposed on the given sidewall in contact with the control element of the switching means and having a longitudinal axis arranged parallel to the longitudinal axis of the trench, and a second electrically conductive line disposed on the major surface of the semiconductor substrate in contact with the current carrying electrode of the switching means and having a longitudinal axis arranged orthogonal to the longitudinal axis of the trench.

In a particular embodiment of the present invention, a dynamic random access memory is provided which includes a semiconductor substrate having a major surface and a trench formed therein, first and second spaced apart storage capacitors disposed along one sidewall of the trench, first and second spaced apart bit/sense diffusion regions disposed along the surface of the substrate and a word line disposed along the one sidewall of the trench between the first and second capacitors and the first and second bit/sense diffusion regions. The memory may further include first and second bit/sense lines connected to the first and second bit/sense diffusion regions, respectively, and arranged orthogonal to the direction of the trench. Furthermore, the memory may include similarly arranged elements on the opposite sidewall of the trench connected to the first and second bit/sense lines.

The foregoing and other objects, features and advantages of the invention will be apparent from the following and more particular description of the preferred embodiments of the invention, as illustrated in the accompanying drawings.

BRIEF DESCRIPTION OF THE DRAWINGS

FIGS. 7, 8, 9 and 10 are sectional views of the cell illustrated in FIGS. 2 and 3 taken during successive steps of the process of making the cells.

BEST MODE FOR CARRYING OUT THE INVENTION

Figure 1:
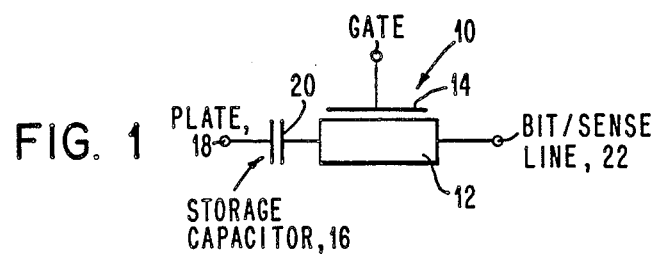
FIG. 1 is a circuit diagram of a dynamic one device memory cell indicating the principal elements thereof.

Referring to the drawings in more detail, there is shown in FIG. 1 a basic circuit diagram of a well known one device dynamic memory cell 10 which includes a field effect transistor 12 having a gate 14, a storage capacitor 16 having a conductive plate 18 and a storage node 20, and a bit/sense line 22. As is known, to store a binary digit in the storage capacitor 16, a high or low voltage is applied to the bit/sense line 22 and the transistor 12 is turned on to charge the storage node 20 if a high voltage was applied to the bit/sense line 22, indicating the presence of, say, a 1 digit, otherwise the storage node 20 remains uncharged, indicating the presence of a stored 0 digit. To read information from the storage capacitor 16, the bit/sense line 22 is charged to a high voltage and the transistor 12 is turned on. If the bit/sense line 22 is discharged, a sense amplifier (not shown) connected to the bit/sense line 22 will indicate the presence of a 0 digit in the storage capacitor 16. If the bit/sense line 22 remains charged, the storage capacitor 16 is storing a 1 digit.

Figure 2:
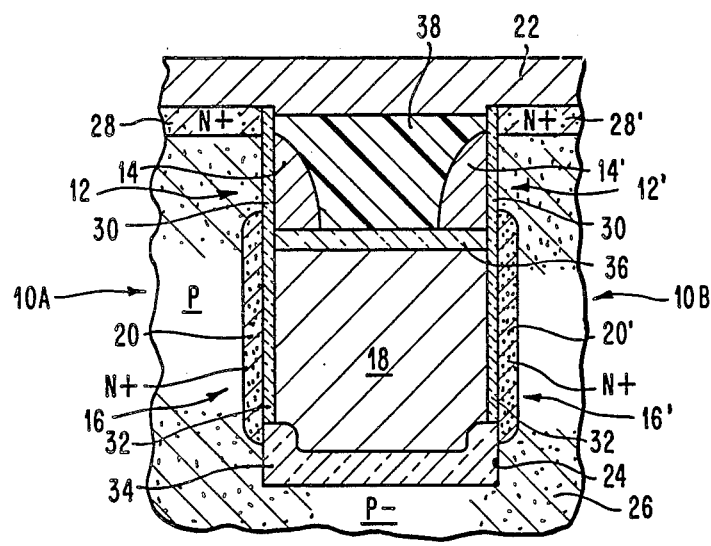
FIG. 2 is a sectional view taken through line 2—2 of FIG. 3 of two dynamic cells of the structure of the present invention.
Figure 3:
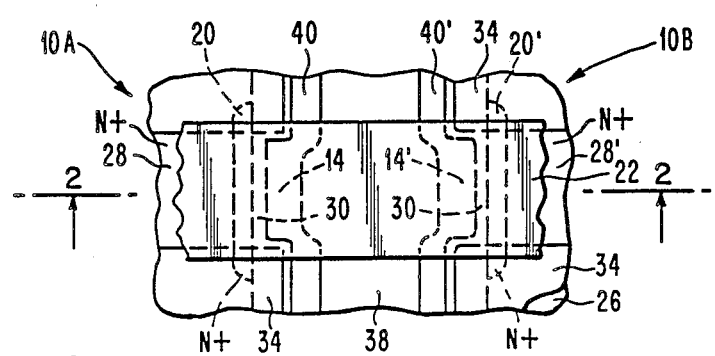
FIG. 3 is a plan view of two cells of the present invention disposed on opposite sidewalls of a trench.

In accordance with the teachings of this invention, a novel vertical structure of the memory circuit of FIG. 1 is illustrated in FIGS. 2 and 3, wherein FIG. 3 is a plan view of the structure and FIG. 2 is a sectional view taken through line 2—2 of FIG. 3. As shown in FIGS. 2 and 3, two dynamic memory cells 10A and 10B are disposed on opposite sidewalls within a trench 24 formed in a semiconductor substrate 26, preferably made of silicon and having a P— conductivity. Cell 10A includes the field effect transistor 12, the storage capacitor 16 and the bit/sense line 22, preferably made of metal such as copper-doped aluminum, with transistor 12 and the capacitor 16 being located within the trench 24 on a first sidewall thereof and the bit/sense line 22 being formed on the surface of the substrate 26 in contact with an N+ diffusion region 28 disposed at the surface of the substrate 26, serving as the drain of the transistor 12. The transistor 12 includes the gate 14, which is preferably made of P-doped polysilicon, tungsten silicide (WSi$_2$) or titanium silicide (TiSi$_2$), or a combination of the polysilicon and a silicide, or of copper-doped aluminum, separated from the first sidewall of the trench 24 by a thin insulating layer 30, preferably a triple insulating layer made of silicon dioxide, silicon nitride and silicon dioxide, or a dual layer made of silicon dioxide and silicon nitride. The storage capacitor 16 includes the storage node 20 made in the form of an N+ diffusion region disposed along the first sidewall of the trench 24 and the conductive plate 18, which may be made of P-doped polysilicon including boron, separated from the node or N+ diffusion region 20 by an insulating layer 32, preferably also a dual or triple insulating layer made of silicon dioxide and silicon nitride.

A thick layer of insulation 34 is disposed between the bottom of the trench 24 and the conductive plate 18, a layer of insulation 36 is preferably grown, to a thickness of about 1000 angstroms, as silicon dioxide on the polysilcon plate 18 so as to isolate the gate 14 from the polysilicon plate 18, and insulating material 38, preferably polyimide or a reflowable glass, such as borophosphosilicate glass, is disposed between the the silicon dioxide layer 36 and the bit/sense line 22.

The second dynamic memory cell 10B is also located within the trench 24 with its field effect transistor 12' and storage capacitor 16' being disposed on the second or opposite sidewall of the trench 24, with the bit/sense line 22 being common to both cells 10A and 10B. The second transistor 12' includes the gate 14', which is preferably made of the same material as gate 14, separated from the second sidewall of the trench 24 by the thin insulating layer 30. The storage capacitor 16' includes the storage node 20' also made in the form of an N+ diffusion region disposed along the second sidewall of the trench 24 within the semiconductor substrate 26 and the conductive plate 18 separated from the N+ diffusion region 20' by the insulating layer 32. An N+ diffusion region 28', serving as the drain of the field effect transistor 12', is connected to the common bit/sense line 22.

Gates 14 and 14' are portions of first and second word lines 40 and 40', respectively, which extend in a vertical direction along the longitudinal axis of the trench 24 and orthogonal to the direction of the bit/sense line 22, as indicated in FIG. 3 of the drawings.

It can be seen from FIGS. 2 and 3 that two very compact one device dynamic memory cells 10A and 10B are provided on opposite sidewalls of a trench 24 isolated from each other, and from any adjacent cells, by the thick insulation layer 34, wherein all elements of the two cells 10A and 10B are located within a trench 24 except for the bit/sense line 22. The trench 24 may be made as deep and as wide as necessary to provide a storage capacitor of desired size and a transistor of desired switching characteristics. In one arrangement of the structure of the present invention, the depth of the trench 24 is preferably 7 microns, with a width of one micron, and the width of the channel of the transistors 12 and 12' being one micron, with the length of the channel being equal to one micron. The layer of insulation 30 forming the gate insulating medium of the transistors 12 and 12' has a thickness of about 18 nanometers, with the thickness of the silicon dioxide layers each being 5 nanometers and the thickness of the silicon nitride layer being 8 nanometers. The thickness of the dielectric layer 32 of the storage capacitor 16 is preferably 13 nanometers, e.g., 4 nanometers of silicon dioxide, 7 nanometers of silicon nitride and 2 nanometers of silicon dioxide. The layers of insulation 30 and 32 may also be made of the same continuous materials and having the same thicknesses. The thick layer of insulation 34 preferably has a thickness of 200 nanometers. The N+ diffusion regions 20 and 20' each extend into the substrate 26 about 150 nanometers from their respective sidewalls of the trench 24. With a spacing between adjacent cells of an array of cells along the word line direction equal to one micron or less and along the bit/sense line direction, which is orthogonal to that of the word line direction, equal to one micron or less, the size of one cell at the surface of the semiconductor substrate may be made equal to 2 square microns or less, which is produced when the lithographic line width is equal to one micron or less. Furthermore, the capacitance of each of the storage capacitors 16 and 16' versus the capacitance of the bit/sense line 22, assuming 64 cells per bit/sense line, provides a very desirable transfer ratio of at least 20%.

Figure 4:
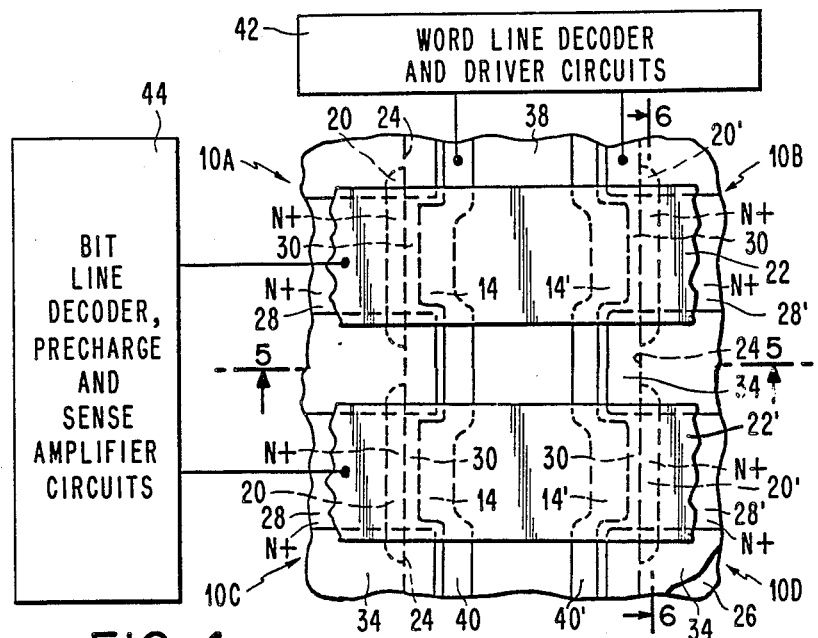
FIG. 4 is a plan view of a 2×2 array of cells, each cell being of the type illustrated in FIGS. 2 and 3, FIGS. 5 and 6 are sectional views of the array illustrated in FIG. 4 taken through lines 5—5 and 6—6, respectively.

FIG. 4 is a plan view of an array of cells, each cell being of the type illustrated in FIGS. 2 and 3 of the drawings, wherein like reference characters refer to similar elements, with two cells 10A and 10B aligned in the horizontal direction along the first bit/sense line 22 and two cells 10C and 10D aligned in the horizontal direction along a second bit/sense line 22'. The cells 10A and 10C are also aligned in the vertical direction along word line 40 and the cells 10B and 10D are aligned in the vertical direction along word line 40'. As is known, each of the word lines 40 and 40' is connected to word decoder and driver circuits 42 for selective actuation and each of the bit/sense lines 22 and 22' may be connected to known bit line decoder, precharge and sense amplifier circuits 44.

Figure 5:
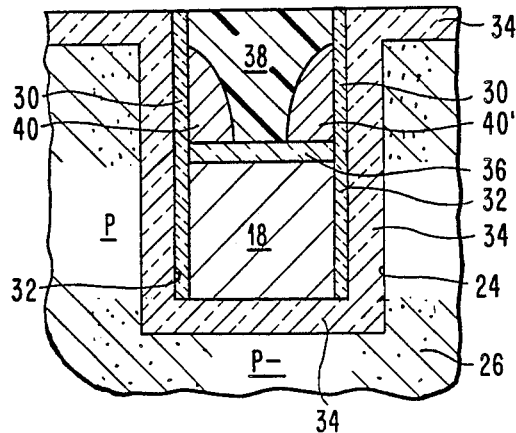
Figure 6:
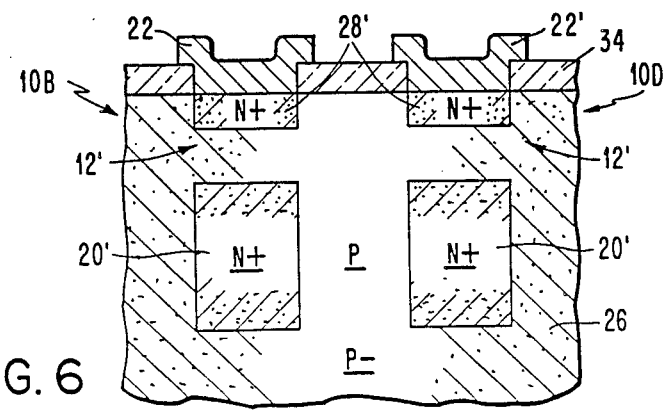

FIG. 5 is a sectional view of FIG. 4 taken through line 5—5 thereof and FIG. 6 is a sectional view of FIG. 4 taken through line 6—6 thereof to more clearly show the details of the elements of the cells 10A, 10B, 10C and 10D of the array.

By referring to FIGS. 4 and 5, wherein FIG. 5 is a sectional view taken orthogonally through the trench 24 in an isolation region between storage nodes of the cells, it can be readily seen that the thick insulating layer 34 is formed along the sidewalls and the bottom of the trench 24 and on the upper surface of the semiconductor substrate 26. The conductive plate 18 is disposed at the bottom of the trench 24 on the thick insulating layer 34, and the word lines 40 and 40' are disposed above the plate 18 on opposite sidewalls of the trench 24, separated from the semiconductor substrate 26 by the thick insulation layer 34 and from the conductive plate 18 by the insulation layer 36. The polyimide or BPSG 38 completes the filling of the trench 24.

By referring to FIGS. 4 and 6 of the drawings, wherein FIG. 6 is a sectional view taken parallel to a sidewall of the trench 24 and through the storage nodes 20' and the drain regions 28', it can be seen that the first bit/sense line 22 contacts, in a self-aligned manner, the drain region 28' of the cell 10B with its storage node 20' spaced from the drain region 28' by the length of the channel of transistor 12', and the second bit/sense line 22' contacts the drain region 28' of the cell 10D with its storage node 20' spaced from the drain region 28' of the cell 10D by the length of the channel of its transistor 12'.

As is known, to write into or read from a random access memory array as shown in FIG. 4, word line decoder and driver circuits 42 and bit line decoder, precharge and sense amplifier circuits 44 of any known type may be used to select any one or more of the cells 10A, 10B, 10C and 10D. Furthermore, it should be understood that the trench 24 may contain hundreds of memory cells along each of the two sidewalls thereof to which the word lines 40 and 40' may be connected and that hundreds of similar spaced apart trenches may be arranged parallel to the trench 24 containing similar memory cells to which the bit/sense lines 22 and 22' may be connected. The trenches 24 may be spaced apart by one lithographic line, i.e., by as short a distance as one micron or less.

Any known process may be used to make the memory cells of the present invention. In one particular process, boron ions with an energy of 10 Mev are implanted through a major surface of the semiconductor substrate 26 to produce a concentration of 1E17 to a depth of about 7 micrometers. The deep trenches 24 about 7 micrometers deep, in the silicon substrate 26 shown in FIGS. 2, 3, 4 and 5 of the drawings may be formed by known reactive ion etching techniques, preferably with the use of any known lithographicly defined silicon dioxide masking layer. After the trenches 24 are formed, the thick insulating layer 34 may be deposited within the trenches 24 and on the surface of the semiconductor substrate 26. The thick insulating layer 34 is removed, preferably by any known multilayer or multilevel photoresist (MLR) process, including a non-erodable layer, from selected segments of the sidewalls of the trenches 24 where the field effect transistors 12 and 12' and the storage capacitors 16 and 16' are to be formed, as well as along the upper surface of the substrate 26 for the formation of the drain regions 28 and 28' of the transistors 12 and 12' as indicated in FIG. 7 of the drawings. The thick insulation layer 34 is retained at the bottom of the trenches 24 by blocking the segment of the thick insulation layer 34 at the bottom of the trenches 34 with a layer of photoresist 46, left in place by terminating the MLR reactive ion etch photoresist etching before reaching the trench bottom, as also indicated in FIG. 7 of the drawings. As can be seen in FIG. 8 of the drawings, in the isolation regions between cells along the sidewalls of the trenches, the layer of photoresist 46 prevents the removal of the thick insulation layer 34 during a wet etch process which removes the unwanted segments of the thick insulation layer 34. If desired, the thick insulation layer 34 may be a dual layer made of grown silicon dioxide and deposited silicon nitride.

After the thick insulation layer 34 has been appropriately etched, a layer of doped silicon dioxide 48, about 20 nanometers thick, is deposited conformally along the sidewalls of the trenches 24. Again with the use of a layer of photoresist (not shown), portions of the doped insulation layer 48 at the upper regions of the trenches 24 are removed, as indicated in FIG. 9 at the cell region and in FIG. 10 at the isolation region of the drawings. More specifically, a preferred processing sequence includes coating the structure with a planarizing photoresist which fills the trenches 24, reactively ion etching the planarized photoresist to the desired level in the trenches 24, and removing the doped silicon dioxide 48 from the upper portion of the trenches 24 using dilute buffered hydrogen fluoride. With the layer 48 appropriately etched, by using known drive-in techniques, the dopant, which is preferably arsenic, in the doped insulation layer 48 is driven into the sidewalls of the trenches 24 to form the N+ diffusion regions or storage nodes 20 and 20', as also indicated in FIG. 9 of the drawings. As can be seen in FIG. 10 of the drawings, since the thick insulation layer 34 is retained on the sidewalls of the trenches 24 between the cells, the arsenic is blocked from entering into the semiconductor substrate 26 at those locations. After drive-in, any appropriate wet etchant, such as the dilute buffered hydrogen fluoride, may be used to remove the remaining segments of the doped insulation layer 48.

With the storage nodes 20 and 20' formed in the sidewalls of the trenches 24, the gate dielectric layer 30 and the storage capacitor dielectric layer 32 may be formed simultaneously by first growing a layer of silicon dioxide and then depositing a layer of silicon nitride, followed by oxidation of the nitrides to form 2-4 nanometers of silicon dioxide on top of the nitride. The conductive plate 18 is formed by depositing doped polysilicon into the trenches 24 and planarizing the polysilicon at the surface of the substrate 26. After the polysilicon is planarized, the polysilicon is removed from the upper portion of the trenches 24 by appropriate etching until the upper surface thereof is located below the upper edge of the storage nodes 20 and 20', as indicated in FIG. 2 of the drawings. The exposed surface of the polysilicon plate 18 is now oxidized to form the layer of silicon dioxide 36, which may be, e.g., 1000 angstroms thick. The gates 14 and 14' of the transistors 12 and 12', respectively, may then be formed by depositing another layer of doped polysilicon over the structure and reactively ion etching the polysilicon until the gates 14 and 14' take on the shape indicated in FIG. 2 of the drawings. If preferred, the polysilicon layer may be followed by the deposition of a layer of tungsten silicide or titanium silicide and then reactively ion etched to provide a dual layered gate structure which is more conductive than a gate which is made of only doped polysilicon. By using reactive ion etching techniques, the silicon dioxide and silicon nitride layers 30, 32 can be removed from all horizontal surfaces, particularly from the drain regions 28 and 28' at the surface of the semiconductor substrate 26. The N+ drain regions 28 and 28' are formed by implanting arsenic at 50 KEV and a dose of 1E15 per centimter square into the exposed surface of the substrate 26. If desired, copper-doped aluminum may also be used to make the gates 14 and 14', but only after the N+ drain regions 28 and 28' have been formed. The remaining portion of the trenches 24 is filled with insulating material 38 such as polyimide or a reflowable glass, e.g., borophosphosilicate glass, and planarized at the major surface of the semiconductor substrate 26. To form the bit/sense lines 22 and 22', a layer of, preferably, copper-doped aluminum is deposited over the surface of the structure and appropriately etched into parallel lines, as more clearly indicated in FIG. 4 of the drawings.

It should be understood that the gate dielectric layer 30 may differ from the capacitor dielectric layer 32 as to composition or thickness, by forming the gate dielectric layer 30 after forming the conductive plate 18.

It can be readily seen in accordance with the teachings of this invention that an improved memory cell has been provided in a vertical structure within a semiconductor substrate requiring a very small cell substrate surface area, i.e., only two lithography squares, not known in the prior art, by forming within a trench or groove the storage means, the switching means and the word line of the cell, with the bit/sense line disposed on the surface of the semiconductor substrate and arranged orthogonal with respect to the the direction of the word line or trench.

While the invention has been particularly shown and described with reference to preferred embodiments thereof, it will be understood by those skilled in the art that various changes in form and details may be made therein without departing from the spirit and scope of the invention.

What is claimed is:

1. A memory comprising
   a semiconductor substrate having a major surface and a trench disposed therein having a longitudinal axis,
   storage means disposed on a given sidewall of said trench,
   switching means having a control element and a current carrying element disposed on said given sidewall of said trench between said storage means and said major surface of said substrate and coupled to said storage means,
   a first electrically conductive line disposed on said given sidewall in contact with said control element of said switching means and having a longitudinal axis arranged parallel to the longitudinal axis of said trench, and
   a second electrically conductive line disposed on said major surface of said semiconductor substrate in contact with said current carrying electrode of said switching means and having a longitudinal axis arranged orthogonal to the longitudinal axis of said trench.

2. A memory as set forth in claim 1 wherein said storage means is a capacitor and said switching means is a field effect transistor.

3. A memory array comprising
   a semiconductor substrate having a major surface and a trench formed therein,
   first and second spaced apart storage means disposed on a first sidewall of said trench,
   third and fourth spaced apart storage means disposed on a second sidewall of said trench,
   first and second switching means disposed on said first sidewall between said first and second storage means, respectively, and said major surface of said substrate,
   third and fourth switching means disposed on said second sidewall between said third and fourth storage means, respectively, and said major surface of said substrate,
   first means disposed within said trench for interconnecting control elements of said first and second switching means,
   second means disposed within said trench for interconnecting control elements of said third and fourth switching means, and
   first and second electrically conductive lines disposed on the major surface of said substrate, said first conductive line being connected to said first and third switching means and said second conductive line being connected to said second and fourth switching means.

4. A memory array as set forth in claim 3 wherein said storage means are capacitors and said switching means are field effect transistors.

5. A memory comprising
   a semiconductor substrate having a major surface and a trench disposed therein, a first storage capacitor disposed on a first sidewall of said trench, said capacitor including a storage node disposed within said semiconductor substrate, a plate disposed within said trench and a dielectric layer interposed between said storage node and said plate, first field effect transistor having a control element disposed on said first sidewall of said trench between said storage capacitor and said major surface of said substrate, a first electrically conductive line disposed within said trench along a sidewall thereof connected to said control element, and a second electrically conductive line disposed on said major surface of said substrate orthogonal to said first line in contact with a current carrying electrode of said transistor.

6. A memory as set forth in claim 5 further including a second storage capacitor disposed on a second sidewall of said trench, and a second field effect transistor disposed on said second sidewall of said trench between said second storage capacitor and said major surface of said substrate, said electrically conductive line being in contact with a current carrying electrode of said second transistor.

7. A memory array comprising a semiconductor substrate having a major surface and a trench formed therein, first and second spaced apart storage capacitors disposed on a first sidewall of said trench, third and fourth spaced apart storage capacitors disposed on a second sidewall of said trench, first and second field effect transistors disposed on said first sidewall between said first and second storage capacitors, respectively, and said major surface of said substrate, third and fourth field effect transistors disposed on said second sidewall between said third and fourth storage capacitors, respectively, and said major surface of said substrate, a first word line disposed within said trench interconnecting gate electrodes of said first and second field effect transistors, a second word line disposed within said trench interconnecting gate electrodes of said third and fourth field effect transistors, and first and second bit/sense lines disposed on the major surface of said substrate, said first bit/sense line being connected to current carrying electrodes of said first and third field effect transistors and said second bit/sense line being connected to current carrying electrodes of said second and fourth field effect transistors.

8. A dynamic random access memory comprising:

a semiconductor substrate having a major surface and a trench having a longitudinal axis formed therein, first and second spaced apart storage capacitors disposed along a first sidewall of said trench, first and second spaced apart bit/sense diffusion regions disposed at the surface of said substrate, and a word line disposed within said trench along the longitudinal axis thereof and insulated from said first sidewall of said trench between said first and second capacitors and said first and second bit/sense diffusion regions, respectively.

9. A dynamic random access memory as set forth in claim 8 further including first and second bit/sense lines connected to said first and second bit/sense diffusion regions, respectively, and arranged orthogonal to the direction of said trench.

10. A dynamic random access memory as set forth in claim 9 wherein said trench has a second sidewall opposing said first sidewall and further including:

third and forth spaced apart storage capacitors disposed along said second sidewall, third and fourth spaced apart bit/sense diffusion regions disposed at the surface of said substrate, and a second word line disposed along said second sidewall between said third and fourth capacitors and said third and fourth bit/sense diffusion regions, respectively, said first and second bit/sense lines being connected to said third and fourth bit/sense diffusion regions, respectively.

11. A dynamic random access memory as set forth in claim 8 wherein each of said storage capacitors includes a diffusion region disposed in said first sidewall and a conductive plate disposed within said trench insulated from said diffusion regions.

12. A dynamic random access memory as set forth in claim 11 further including an insulation layer disposed on said conductive plate between said word line and said conductive plate.

13. A dynamic random access memory as set forth in claim 11 wherein said conductive plate is made of doped polysilicon and said word line is made of a silicide.

14. A dyanmic random access memory as set forth in claim 10 wherein each of said storage capacitors includes a diffusion region disposed in one of said first and second sidewalls and a conductive plate disposed within said trench insulated from said diffusion regions.

15. A dyanamic random access memory as set forth in claim 14 further including an insulation layer disposed on said conductive plate between said word lines and said conductive plate.

16. A dynamic random access memory as set forth in claim 14 wherein said conductive plate is made of doped polysilicon, said word lines are made of doped polysilicon and said bit/sense lines are made of copper-doped aluminum, and further including an insulating medium disposed between said first and second word lines.

17. A dynamic random access memory as set forth in claim 16 wherein said insulating medium is polyimide.

18. A dynamic random access memory as set forth in claim 8 further including a thick layer of insulation disposed on said first sidewall between said first and second storage capacitors and between said first and second bit/sense diffusion regions.

19. A memory comprising a semiconductor substrate having a major surface and a trench disposed therein having a longitudinal axis, first and second storage means disposed on a first sidewall of said trench, first and second switching means each having a control element and a current carrying element, disposed on said first sidewall of said trench between said first and second storage means, respectively, and said major surface of said substrate and coupled to said respective storage means, a first electrically conductive line disposed on said first sidewall in contact with the control elements of said first and second switching means and having a longitudinal axis arranged parallel to the longitudinal axis of said trench, and second and third electrically conductive lines disposed on said major surface of said semiconductor substrate in contact with said current carrying electrode of said first and second switching means, respectively, and each having a longitudinal axis arranged orthogonal to the longitudinal axis of said trench.

20. A memory comprising a semiconductor substrate having a major surface and a trench disposed therein having first and second opposing sidewalls and a longitudinal axis, first and second storage means disposed on a first sidewall of said trench, first and second switching means each having a control element and a current carrying element, disposed on said first sidewall of said trench between said first and second storage means, respectively, and said major surface of said substrate and coupled to said respective storage means, a first electrically conductive line disposed on said first sidewall in contact with the control elements of said first and second switching means and having a longitudinal axis arranged parallel to the longitudinal axis of said trench, second and third electrically conductive lines disposed on said major surface of said semiconductor substrate in contact with said current carrying electrode of said first and second switching means, respectively, and each having a longitudinal axis arranged orthogonal to the longitudinal axis of said trench, third and fourth storage means disposed on said second sidewall, third and fourth switching means, each having a control element and a current carrying element, disposed on said second sidewall, and a fourth electrically conductive line disposed on said second sidewall in contact with the control elements of said third and fourth switching means and having a longitudinal axis arranged parallel to the longitudinal axis of said trench, said second and third electrically conductive lines being connected to the current carrying elements of said third and fourth switching means, respectively.

21. A memory as set forth in claim 20 wherein each of said storage means is a capacitor having a diffusion region in said substrate and a conductive plate insulated from said sidewalls.

22. A memory as set forth in claim 21 wherein the diffusion regions of said first and second capacitors and the diffusion regions of said third and fourth capacitors are separated by first and second layers of insulation, respectively.

23. A memory as set forth in claim 22 wherein said conductive plate and said first and fourth conductive lines include doped polysilicon and said second and third lines include aluminum.

* * * * *

Notice of Adverse Decision in Interference

In Interference No. 101,269, involving Patent No. 4,769,786, R. R. Garnache, D. M. Kenny, TWO SQUARE MEMORY CELLS, final judgement adverse to the patentees was rendered Jan. 28, 1991, as to claims 1-17 and 19-21.

*(Official Gazette March 5, 1991)*